United States Patent
Bangert et al.

(10) Patent No.: US 7,893,750 B2
(45) Date of Patent: Feb. 22, 2011

(54) ELECTRICAL COMPONENT HAVING CONFIGURABLE CHARACTERISTICS THAT ARE NON-VOLATILE

(75) Inventors: Joachim Bangert, Erlangen (DE); Markus Köchy, Isernhagen (DE); Christian Siemers, Wolfsburg (DE)

(73) Assignee: Siemens Aktiengesellschaft, Munich (DE)

( * ) Notice: Subject to any disclaimer, the term of this patent is extended or adjusted under 35 U.S.C. 154(b) by 249 days.

(21) Appl. No.: 11/997,501

(22) PCT Filed: Jul. 19, 2006

(86) PCT No.: PCT/EP2006/064419
§ 371 (c)(1),
(2), (4) Date: Sep. 15, 2008

(87) PCT Pub. No.: WO2007/014857
PCT Pub. Date: Feb. 8, 2007

(65) Prior Publication Data
US 2010/0019830 A1    Jan. 28, 2010

(30) Foreign Application Priority Data
Aug. 1, 2005    (DE) .................. 10 2005 036 066

(51) Int. Cl.
*H03K 17/00*    (2006.01)
(52) U.S. Cl. .................. 327/427; 327/434; 327/436; 327/437
(58) Field of Classification Search .......... 327/427, 327/434, 436, 437
See application file for complete search history.

(56) References Cited

U.S. PATENT DOCUMENTS

| | | | |
|---|---|---|---|
| 4,870,302 A | 9/1989 | Freeman | 307/465 |
| 5,541,529 A * | 7/1996 | Mashiko et al. | 326/39 |
| 6,278,640 B1 * | 8/2001 | Lines | 365/189.11 |
| 6,320,446 B1 * | 11/2001 | Podlesny et al. | 327/333 |
| 6,515,511 B2 * | 2/2003 | Sugibayashi et al. | 326/41 |
| 6,577,161 B2 * | 6/2003 | Sun et al. | 326/49 |
| 6,768,338 B1 * | 7/2004 | Young et al. | 326/44 |
| 7,212,462 B1 * | 5/2007 | Tuan | 365/226 |
| 7,368,946 B1 * | 5/2008 | Rahman et al. | 326/46 |
| 2005/0093574 A1 | 5/2005 | Fujita | 326/41 |
| 2007/0164781 A1 | 7/2007 | Bangert et al. | 326/38 |

FOREIGN PATENT DOCUMENTS

| | | |
|---|---|---|
| DE | 10320701 | 12/2004 |
| WO | 2004100170 | 11/2004 |

OTHER PUBLICATIONS

International Search Report; PCT/EP2006/064419; p. 4.

* cited by examiner

*Primary Examiner*—Kenneth B. Wells
(74) *Attorney, Agent, or Firm*—King & Spalding, L.L.P.

(57) ABSTRACT

A component with a functionally-configurable circuit arrangement, has a first switch group with a voltage-dependent switching on or off of a data line and at least one second switch group generating two discrete output voltages separated by an increase in voltage and the switch states for the discrete output voltages may be stored in non-volatile memory. The switching on or off of the data line is determined by the switch state of the first switch group and a third switch group (11) is provided to increase the voltage increase between the first switch group (17) and the second switch group (3).

16 Claims, 2 Drawing Sheets

ELECTRICAL COMPONENT HAVING CONFIGURABLE CHARACTERISTICS THAT ARE NON-VOLATILE

CROSS-REFERENCE TO RELATED APPLICATIONS

This application is a U.S. national stage application of International Application No. PCT/EP2006/064419 filed Jul. 19, 2006, which designates the United States, and claims priority to German application number 10 2005 036 066.1 filed Aug. 1, 2005, the contents of which are hereby incorporated by reference in its entirety.

TECHNICAL FIELD

The invention relates to a component having a configurable-functionality circuit arrangement.

BACKGROUND

Such a circuit arrangement comprises a first switching group, enabling or disabling a data line on the basis of voltage, and at least one second switching group, producing two discrete output voltages differing in terms of a voltage swing, whose switching states associated with the discrete output voltages can be stored on a nonvolatile basis, the disabling or enabling of the data line being able to be stipulated by the switching state of the second switching group.

Configurable components have been known for a long time and are referred to generally as programmable logic devices (PLDs), since they preferably perform logic functions. Such PLD components are used primarily for less complex tasks. Logic chips of this kind are known, by way of example, from U.S. Pat. No. 4,870,302 or the publication "Ranmuthu, I. W. et al.; Magneto-resistive elements—An Alternative to Floating Gate Technology; in: Proceedings of the Midwest Symposiums on Circuits and Systems, 1992, pg(s). 134-136 vol. 1". Such logic chips involve the application program being defined during booting: a program is read from a program store and configurable areas are configured. The configurable areas have the following properties: either they define links between prescribed points (routing areas) or they define the processing of logic input signals to form logic output signals (logic cell areas).

The programming information is distributed in the surface area. The configurability of the PLDs is limited to a few configurable parameters which are set permanently during booting. Two memories are required in this context: an external boot memory chip (discrete chip, e.g. an EEPROM 113 in U.S. Pat. No. 4,870,302) and internal memory cells distributed over the surface area (e.g. as shown in FIGS. 3a and 10a in U.S. Pat. No. 4,870,302 or FIG. 5 in the publication by Ranmutha et al.). After booting, the local memory cells contain information for the links and for the logic functions of the cells.

Fundamental parameters for assessing the performance of these memories are surface area requirement and static (leakage) power consumption as static "costs" and also switching speed and switching capacity as dynamic "costs". The text which follows considers only nonvolatile, reconfigurable architectures, namely SRAM in combination with Boot-ROM or EEPROM. The SRAM is a relatively large cell, has a fast operating speed and is a volatile memory, whereas the Boot-ROM is slow and nonvolatile. The EEPROM is a medium-sized cell with a slow operating speed, a high configuration power requirement and a low "read" power consumption.

The surface-area efficiency and power-loss efficiency of distributed memory cells is approximately up to two orders of magnitude worse than that of discrete memory chips having the same performance. If the application program requires lower performance than the chips provide, however, the unused areas inevitably likewise produce a power loss. Typical utilization levels for the logic blocks provided in PLDs are approximately 30% to 70%. At one particular time, only fractions of these are actively involved in processing logic information.

The links distributed over the entire chip can be set only by boot operations in the case of conventional components. Dynamic configuration of the links could increase the utilization level.

DE 103 20 701 A1 therefore proposes the use of just a single component integrating a rapidly switchable, nonvolatile memory. Specifically, TMR (Tunnel Magneto-Resistive) cells are proposed for this purpose. Such magneto-resistive elements are distinguished by virtue of their resistive behavior being determined by the condition of the magnetization of a magnetically soft information layer relative to a magnetically hard reference layer. Depending on whether the magnetizations are parallel or in opposition to one another, a low or high resistance is produced across the element. The direction of magnetization of the magnetically soft layer can be changed easily and quickly, to which end a configuration current pulse which is carried by a configuration conductor and produces a magnetic field acting on the magnetization of the magnetically soft layer is used.

The TMR technologies usually available have only a resistance change of 50% between the two discretely switchable resistors, however, that is to say that the ratio of the lower resistance to the higher resistance is approximately 2:3. If one also considers that currently available TMR elements can take a voltage drop of no more than approximately 600 mV without being destroyed, the resistance ratio is in most cases not sufficient to connect a data line to the components described in the prior art, since the resistor elements which can be switched between two states with different discrete resistance values can have only a certain maximum voltage applied to them, and therefore the voltage swing is limited.

SUMMARY

A component can be provided which, despite using resistor elements with a low resistance ratio, is suitable for use as a PLD and also saves space and allows rapid switching times.

According to an embodiment, a component may have a configurable-functionality circuit arrangement, and may comprise a first switching group, which enables or disables a data line on the basis of voltage, and further switching groups, among which at least one second switching group, which produces two discrete output voltages differing in terms of a voltage swing, where switching states associated with the output voltages can be stored on a nonvolatile basis and where the disabling or enabling of the data line can be stipulated by the switching state of the second switching group, and where a third switching group is provided in order to increase the magnitude of the voltage swing between the first switching group and the second switching group.

According to another embodiment, the first switching group may comprise a pass transistor. According to another embodiment, the second switching group may comprise at least one resistor element which can be switched between two states with different discrete resistances and whose switching states, which can be stored on a nonvolatile basis, determine the voltage swing between the two discrete output voltages.

According to another embodiment, the second switching group may be a voltage divider. According to another embodiment, two resistor elements may be provided which are respectively actuated in opposite directions. According to another embodiment, the inequality 0V<=U1<U2<=Ub may apply for the voltages U1 and U2 applied to the voltage divider and voltages Ub and 0V applied to the third switching group. According to another embodiment, the resistor element(s) may have a ratio between the two discrete resistances of essentially 2:3. According to another embodiment, the third switching group may comprise n-channel and p-channel transistors connected as an inverter circuit. According to another embodiment, the third switching group may comprise CMOS transistors. According to another embodiment, the resistor element may be a resistor element which exhibits a magneto-resistive effect. According to another embodiment, the resistor element may be a TMR cell. According to another embodiment, a dual cell having two resistor elements may be provided in which two resistor elements are connected in series and can be actuated in the same direction. According to another embodiment, the dual cell can be mounted in a stacked design. According to another embodiment, the component can be manufactured together with base cells from a lookup table.

BRIEF DESCRIPTION OF THE DRAWINGS

Other advantages and details of the invention can be found in the exemplary embodiment described below and with reference to the figures, in which.

DETAILED DESCRIPTION

Figure 1:
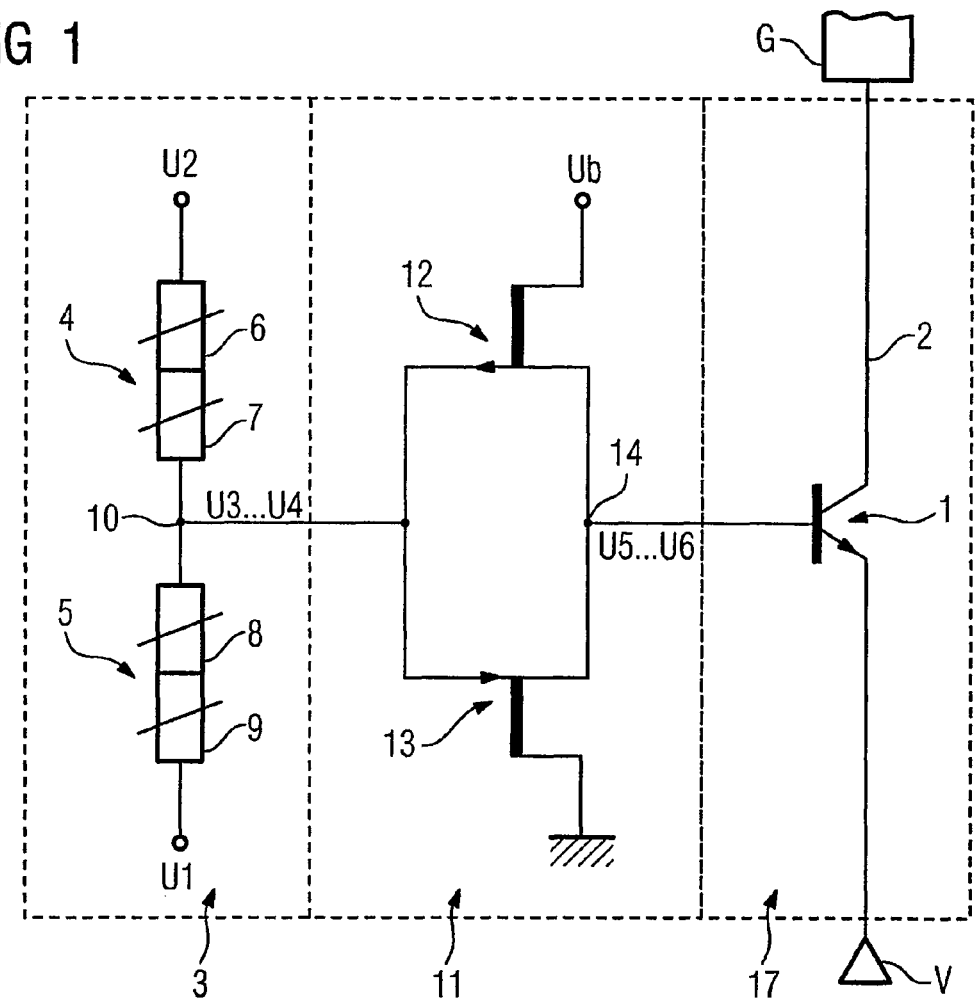
FIG. 1 shows the circuit diagram for a component according to an embodiment, of the present invention.

According to various embodiments, a component of the type cited at the outset may contain not only the first and second switching groups but also a third switching group in order to increase the magnitude of the voltage swing between the first switching group and the second switching group.

In the frequent case in which the voltage swing of the second switching group is not sufficient to enable or disable the data line adequately, the advantageous effect achieved by the additional, third switching group is that the magnitude of the voltage swing is increased as appropriate. Hence, it is then possible to achieve the effect that the first switching group is either fully on (minimum resistance) or fully off (maximum resistance). The amplitude of the signals sent through the data line can be reduced because low losses and good blocking are obtained.

The first switching group may comprise at least one switchable resistor element which can be switched between two states with different discrete resistances and whose switching states, which can be stored on a nonvolatile basis, determine the voltage swing between the two discrete output voltages. If the resistance ratio of the resistor element(s) is too small to actuate the enabling or disabling switching element directly, according to various embodiments, the further switching group increases the magnitude of the voltage swing, in other words the switching signal is amplified.

In this context, according to a further embodiment, the first switching group may comprise a pass transistor. When this transistor is turned off, the data line is also disabled at the same time, which means that no information can be transmitted. The increased actuation voltage, according to various embodiments, on the pass transistor means that, in the other switching state, said pass transistor has a resistance which is low enough for information (signals) to be able to be transmitted via the data line almost without any losses.

According to an embodiment, the second switching group in the component may be in the form of a voltage divider. If one of the resistors in such a voltage divider, which comprises two resistors, is in the form of a resistor element which can be switched between two states with different discrete resistances then the voltage tapped off between the two resistors is dependent on the switching state of the resistor element. Particularly advantageously, two such resistor elements may be provided which are respectively actuated in opposite directions. In one such embodiment, a relatively large voltage swing can be achieved by virtue of the other resistance being decreased whenever one resistance is increased.

When such a voltage divider is used, it is ideally possible for the inequality $0V \leqq U1 < U2 \leqq Ub$ to apply for the voltages U1 and U2 applied to the voltage divider and voltages Ub and 0V applied to the other circuit group. In practice, it has been found that in such a parameter range the magnitude of the voltage swing can most likely be increased.

The resistor element(s) may have a ratio between the two discrete resistances of approximately 2:3. Such a ratio, which was hardly suitable for obtaining the desired switching response in conventional components, is entirely satisfactory within the context of the present embodiments.

According to an embodiment, the third switching group may comprise n-channel and p-channel transistors connected as an inverter circuit. Such an inverter circuit can be implemented in a small space without any difficulty and can therefore be integrated into the component with a space saving. Furthermore, it affords outstanding switching properties which can therefore advantageously be used for amplifying the voltage swing. Specifically, the third switching group may also comprise CMOS transistors. This is the case when homogeneous transistors are used as n-channel and p-channel transistors. In this case too, the production techniques for such transistors can continue to be used according to various embodiments.

Particularly advantageously, the resistor element is an element which exhibits a magneto-resistive effect, particularly a TMR cell. TMR cells are distinguished particularly by their short switching times in the range of a few nanoseconds; usually, the switching times are shorter than five nanoseconds, and often even shorter than three nanoseconds. Thus, by way of example, even "toggle circuits" operated at high frequency are possible according to an embodiment. Such circuits can be used, by way of example, when every second signal needs to be processed in a different manner than the other signals.

According to an embodiment, a dual cell having two resistor elements may be provided in which the two resistor elements are connected in series. In this case, the dual cell may be mounted in a stacked design so as to save space. This means that twice the voltage can be applied to the resistor elements, for example the TMR cells, so that overall this design alone results in the voltage swing being doubled. A further advantage is obtained through the stacked design. Not only does it use up particularly little space but also the fundamental design of the voltage divider corresponds to the design of the base cell from what is known as a "lookup table (LUT)", in which input signals can be compared with reference signals and a logic output is produced in line with this comparison. This means that the methods of manufacture known from the base cell can continue to be used for the voltage divider, according to an embodiment.

FIG. 1 shows the circuit diagram for a component according to an embodiment of the present invention. In this case, a pass transistor 1 in a first switching group 17 is intended to either enable or disable the flow of signals on a data line 2, according to a configuration which is stored in the resistor elements in a second switching group 3. The data line 2 may link an amplifier V and a gate G to one another, for example. However, it is equally possible for individual logic cells to be selectively connected to one another or for the transfer of signals between them to be prevented.

The second switching group 3, whose basic circuit is a voltage divider, comprises two dual cells 4 and 5 which respectively comprise two series-connected TMR cells 6 and 7, and 8 and 9. The switching state of the two TMR cells in each dual cell is always the same, and the dual cells 4 and 5 are actuated inversely, that is to say that they are always in opposite switching states. Thus, if the dual cell 4 has a high resistance, the resistance of the dual cell 5 is low. If, by contrast, the resistance of the dual cell 4 is switched to low, the resistance of the dual cell 5 is high. The voltage on the tap point 10 situated between the resistors is dependent on the respective switching state of the dual cells 4 and 5 and provides the fundamental switching information for the pass transistor 1. If the resistance of the dual cell 5 is high then a high voltage U3 with respect to ground can be tapped off at point 10, and if the resistance of the dual cell 5 is low and hence the resistance of the dual cell 4 is high then a lower voltage U4 is tapped off. The difference U3-U4 indicates the voltage swing $\Delta U$. Since TMR cells are used in which the ratio between the low resistance and the high resistance is in the region of approximately 2:3, the voltage swing $\Delta U$ is in most cases not sufficient to change over the pass transistor 1 directly from an entirely off state to an entirely on state.

A third switching group 11 is therefore provided in order to increase the magnitude of the voltage swing between the second switching group 3 and the first switching group 17. The further switching group 11 comprises two transistors connected as an inverter circuit, namely a p-channel transistor 12 and an n-channel transistor 13. Such an inverter circuit (also called a "NOT" circuit) has the property that either only the transistor 12 or only the transistor 13 may be on. With a suitable choice of voltage Ub, a gain is thus achieved for the voltage swing, that is to say that the difference between the voltages $\Delta U'=U5-U6$ which can be tapped off at point 14 according to the switching state is greater than the voltage swing $\Delta U=U3-U4$. The amplified voltage swing $\Delta U'$ is suitable for switching the pass transistor 1 with the desired switching response, however.

The fact that the voltages U3 and U4 are suitable for respectively turning off one of the transistors 12 or 13 completely and turning on the respective other transistor completely means that the power loss arising in the third switching group 11 is minimized. The transistors 12 and 13 are homogeneous; they are CMOS transistors.

The specific values for the applied voltages U1, U2 and Ub are obtained from the materials and type of the TMR cells and transistors used in the component. In general, however, the following inequality applies:

$$\text{ground}=0\ V \leq U1 < U2 \leq Ub$$

In the present exemplary embodiment, the TMR cells have a resistance ratio of 2:3 and it has been possible to determine Ub=1.5 V, U1=0.15 V, U2=1.35 V as ideal values for the voltages. Hence, the voltages U3=0.45 V and U4=1.05 V are reached at point 10, which produce a voltage swing of 0.6 V. This is sufficient to switch the transistors 12 and 13 completely. This ideally results in a value of 1.5 or 0 V for the voltages U5 and U6, which means that the voltage swing is $\Delta U'=1.5$ V. This is then sufficient to switch the pass transistor 1.

The large difference between U2 and U1 of 1.2 V can be achieved only by the dual cells 5 and 4. Normally, a voltage of no more than 600 mV can be applied to a TMR cell without destroying it. The use of the dual cells 4 and 5 therefore in principle allows this voltage to be doubled.

Figure 2:
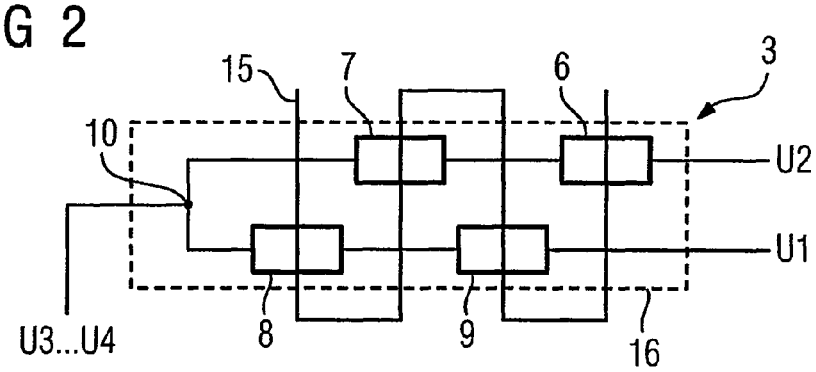
FIG. 2 shows a basic outline of the design and circuitry of a second switching group according to an embodiment, of the present invention.
Figure 3:
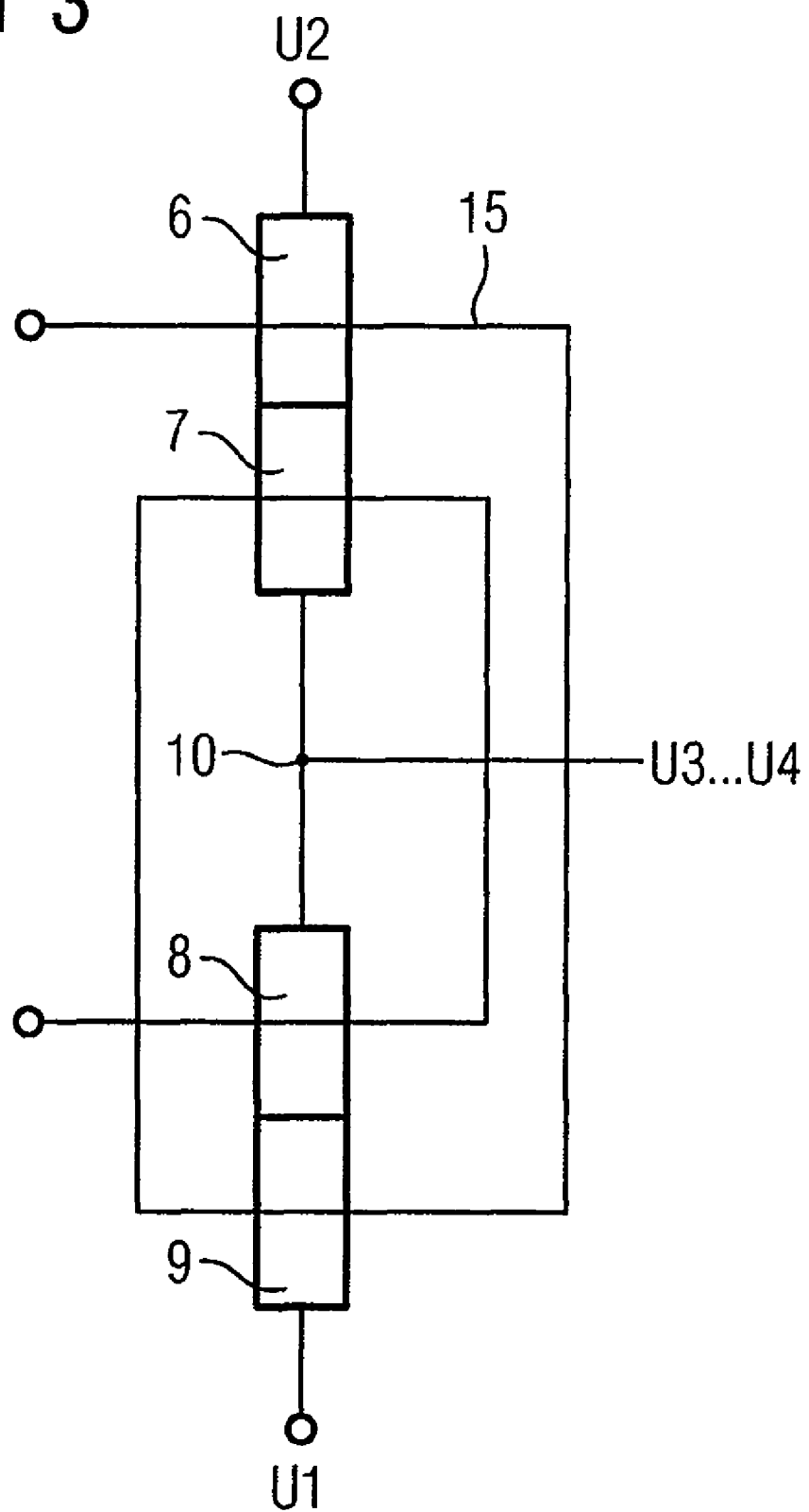
FIG. 3 shows the circuit diagram for the basic outline from FIG. 2.

FIG. 2 shows the basic design and the actuation of the second switching group 3 from FIG. 1; for better comparison, FIG. 3 shows the associated circuit diagram which can be fitted into FIG. 1. In FIG. 2, the respective voltages U2 and U1 are applied on the right, and on the left the voltage U3 or U4 is tapped off according to the switching state. The TMR cells 6 and 7, and 8 and 9, are respectively connected in series. The data line 15 forms the switching line for the TMR cells. As can be seen from the progression of the line 15, the cells 6 and 7 respectively receive an inverted switching signal in comparison with the cells 8 and 9. Since the direction of the current is opposite, the switching field produced by the current is also respectively in another direction and the magnetically soft layers are switched in line with this field direction. The dashed border 16 identifies the area whose design and production method are already known from the field of base cells. In a base cell, the basic building block for a lookup table (LUT), two input values are compared with two reference values, and the output value obtained is a signal which is dependent on the input values. This design can be retained, it merely being necessary to continue the switching line 15 into the areas situated outside of the border 16, as indicated. Such a compatible design means that both the PLD cells and the base cells can be put onto a chip or a board, for example, in the same production step.

The invention claimed is:

1. An electrical component having configurable characteristics that are non-volatile, comprising:
   a plurality of tunnel magneto-resistive (TMR) cells connected in series and arranged in groups of at least one first TMR cell and at least one second TMR cell, wherein each of the plurality of TMR cells are independently capable of being magnetized to have either a first resistance value or a second resistance value depending upon application of a configuration current pulse passing therethrough;
   a first end of the plurality of TMR cells is connected to a first voltage and a second end of the plurality of TMR cells is connected to a second voltage;
   a configuration conductor passes through the at least one first TMR cell in a first magnetization direction and the at least one second TMR cell in a second magnetization direction, wherein
      when the configuration current pulse is applied in a first way to the configuration conductor the at least one first TMR cell will be magnetized to have the first resistance value and the at least one second TMR cell will be magnetized to have the second resistance value, and
      when the configuration current pulse is applied in a second way to the configuration conductor the at least one first TMR cell will be magnetized to have the second resistance value and the at least one second TMR cell will be magnetized to have the first resistance value; and a voltage amplifier having an input and an output, the input is coupled to a series connection between the at least one first TMR cell and at least one second TMR cell, wherein the voltage amplifier output is at
   a first logic level when the at least one first TMR cell is at the first resistance value and the at least one second TMR cell is at the second resistance value, and
   a second logic level when the at least one first TMR cell is at the second resistance value and the at least one second TMR cell is at the first resistance value.

2. The electrical component according to claim 1, further comprising a pass transistor coupled to and controlled by the voltage amplifier.

3. The electrical component according to claim 1, wherein the voltage amplifier comprises N-channel and P-channel transistors connected as an inverter circuit.

4. The electrical component according to claim 1, wherein the voltage amplifier comprises a complementary metal oxide semiconductor (CMOS) inverter circuit.

5. The electrical component according to claim 1, wherein the at least one first and second TMR cells are at least two first and second TMR cells connected in series for improved voltage withstand.

6. The electrical component according to claim 1, wherein two TMR cells are configured as a dual TMR cell having the two TMR cells connected in series and having the configuration conductor passing through each of the two TMR cells in the same magnetization direction.

7. The electrical component according to claim 6, wherein a first dual TMR cell has the configuration conductor passing through in the first direction and a second dual TMR cell has the configuration conductor passing through in the second direction, wherein when the configuration current pulse is applied in the first way to the configuration conductor the first dual TMR cell will be magnetized to have about twice the first resistance value and the second dual TMR cell will be magnetized to have about twice the second resistance value, and when the configuration current pulse is applied in the second way to the configuration conductor the first dual TMR cell will be magnetized to have about twice the second resistance value and the second dual TMR cell will be magnetized to have about twice the first resistance value.

8. The electrical component according to claim 7, wherein the first and second dual TMR cells are stacked.

9. The electrical component according to claim 1, wherein the plurality of TMR cells are fabricated on an integrated circuit die with base cells of a lookup table.

10. The electrical component according to claim 1, wherein the first resistance value is greater than the second resistance value.

11. The electrical component according to claim 1, wherein the first resistance value is less than the second resistance value.

12. The electrical component according to claim 7, wherein a voltage difference between the first and second voltages is about 1.2 volts.

13. The electrical component according to claim 1, wherein the configuration current pulse is applied in the first way by applying the configuration current pulse to the configuration conductor in a first direction, and in the second way by applying the configuration current pulse to the configuration conductor in a second direction.

14. The electrical component according to claim 1, wherein the configuration current pulse is applied in the first way by applying the configuration current pulse to the configuration conductor with a first polarity, and in the second way by applying the configuration current pulse to the configuration conductor with a second polarity.

15. An electrical component having configurable characteristics that are non-volatile, comprising:
   a plurality of tunnel magneto-resistive (TMR) cells connected in series, wherein each of the plurality of TMR cells are independently capable of being magnetized to have either a first resistance value or a second resistance value depending upon application of a configuration current pulse passing therethrough;
   a first end of the plurality of TMR cells is connected to a first voltage and a second end of the plurality of TMR cells is connected to a second voltage;
   a configuration conductor passes through a first half of the plurality of TMR cells in a first magnetization direction and through a second half of the plurality of TMR cells in a second magnetization direction, wherein
      when the configuration current pulse is applied in a first way to the configuration conductor the first half of the plurality of TMR cells will be magnetized to have the first resistance value and the second half of the plurality of TMR cells will be magnetized to have the second resistance value, and
      when the configuration current pulse is applied in a second way to the configuration conductor the first half of the plurality of TMR cells will be magnetized to have the second resistance value and the second half of the plurality of TMR cells will be magnetized to have the first resistance value; and
   the first half of the plurality of TMR cells are grouped and series connected together and the second half of the plurality of TMR cells are grouped and series connected together;
   a voltage amplifier having an input and an output, the input is coupled to a series connection between the first and second halves of the plurality of TMR cells, wherein the voltage amplifier output is at
      a first logic level when the first half of the plurality of TMR cells are each at the first resistance value and the second half of the plurality of TMR cells are each at the second resistance value, and
      a second logic level when the first half of the plurality of TMR cells are each at the second resistance value and the second half of the plurality of TMR cells are each at the first resistance value.

16. The electrical component according to claim 15, wherein pairs of the plurality of TMR cells are configured as a plurality of dual TMR cells connected in series and having the configuration conductor passing through half of the plurality of dual TMR cells in the first magnetization direction, and the other half of the plurality of dual TMR cells in the second magnetization direction.

* * * * *